United States Patent

Hasegawa

[11] Patent Number: 5,867,235
[45] Date of Patent: Feb. 2, 1999

[54] ASSEMBLING CONSTRUCTION OF A DISPLAY APPARATUS AND ASSEMBLING METHOD THEREFOR

[75] Inventor: Hiroshi Hasegawa, Tokyo, Japan

[73] Assignee: Niles Parts Co., Ltd., Japan

[21] Appl. No.: 575,166

[22] Filed: Dec. 19, 1995

[30] Foreign Application Priority Data

Dec. 20, 1994 [JP] Japan ................................ 6-334839

[51] Int. Cl.$^6$ ...................... G02F 1/1333; G02F 1/1345
[52] U.S. Cl. ............................ 349/58; 349/149; 29/830; 340/636
[58] Field of Search ........................ 349/58, 149; 29/830; 340/636

[56] References Cited

U.S. PATENT DOCUMENTS

| | | | |
|---|---|---|---|
| 4,404,522 | 9/1983 | Pucciarello | 324/114 |
| 4,633,239 | 12/1986 | Nalbanti | 340/636 |
| 5,093,985 | 3/1992 | Houldsworth et al. | 29/830 |

FOREIGN PATENT DOCUMENTS

Hei 3-51395  5/1991  Japan .

Primary Examiner—William L. Sikes
Assistant Examiner—Julie Ngo
Attorney, Agent, or Firm—Rader, Fishman & Grauer; Ronald P. Kananen

[57] ABSTRACT

A display apparatus having a single-sided board 1, a display device 2, and terminals 3. The single-sided board 1 has a through-hole 14 formed therein, and conductive tracks 12 and fixed contacts 13 formed on one side 11 thereof. The display device 2 is mounted on the other side 15 of the single-sided board 1. The terminals 21 of the display device 2 extend through respective holes in the single-sided board 1. The terminals 21 project from the one side 11 of the single-sided board 1 and are soldered to the conductive tracks 12. The display surface 22 appears in the through-hole 14. The terminals 3 are mounted on the other side 15 of the single-sided board 1 and first ends 31 of the terminals 3 extend through respective holes in the single-sided board 1 and project from the one side 11 of the single-sided board 1. The terminals 3 are soldered to the conductive tracks 12, and the other ends 32 of the terminals 3 are electrically connected to a circuit on the vehicle side. The construction and assembling procedure of the display apparatus are simplified both by performing only a single stage of soldering operation and by eliminating switches.

3 Claims, 2 Drawing Sheets

Fig. 2

| Manufacture a single sided board 1 having a through hole 14 formed therein and conductive tracks 12 and fixed contacts 13 formed on one side 11 of the single sided board 1. | ········ A: First stage |

| Mount a display device 2 on the other side 15 of the single sided board 1 while the display surface 22 of the display device 2 appearing in the through-hole 14. | ········ B: Second stage |

| Solder to the conducting tracks 12 the terminals 21 of the display device 2 projecting from the one side 11 of the single sided board 1. | ········ C: Third stage |
ASSEMBLING CONSTRUCTION OF A DISPLAY APPARATUS AND ASSEMBLING METHOD THEREFOR

BACKGROUND OF THE INVENTION

1. Field of the Invention

The present invention relates to an improved assembling construction of a display apparatus for use with, for example, an on-vehicle digital clock.

2. Description of the Related Art

This type of conventional display apparatus is of the construction that inherently necessitates use of a combination of a plurality of boards or a double-sided board. Such construction is complex and, therefore, the manufacture of the apparatus is not easy. Japanese Utility Model Unexamined Publication No. 3-51395 discloses one solution to the problem where all the circuit parts, including the display device and operating switches, are mounted on one single-sided printed circuit board.

The prior art disclosed in Japanese Utility Model Unexamined Publication No. 3-51395 solves the aforementioned problem by the use of one single-sided printed circuit board. However, the construction shown in FIG. 1 of this prior art publication needs to employ operation switches, such as so-called tact switches, which are of a construction independent from the others. With the construction shown in FIG. 2 of the same prior art publication, the display device is mounted on the soldered side of the printed circuit board. This necessitates mounting operation of the display device by manual soldering after the board has undergone soldering operation in a solder bath.

Thus, the assembling construction and assembling method of the display apparatus are yet to be simplified.

SUMMARY OF THE INVENTION

It is an object of the present invention to solve the problems of the aforementioned prior art. More particularly, it is an object of the present invention to provide a display apparatus having a simple assembling construction and assembling method.

In order to achieve the aforementioned objects, the invention provides a display apparatus comprising a single-sided board having fixed contacts and electrically conductive tracks on a first side thereof, a through-hole formed in the single-sided board, and a display device mounted on a second side of the single-sided board, the display device having terminals and a display surface appearing in the through-hole, the terminals extending through respective holes in the single-sided board from one side to the other side of the single-sided board and being soldered to the electrically conductive tracks on the first side.

The aforementioned invention also provides a display apparatus comprising terminals extending through holes in the single-sided board and having first ends thereof projecting from the first side of the single-sided board and being soldered to the electrically conductive tracks, and second ends of the terminals being electrically connected to the circuit on the vehicle side.

The aforementioned invention also provides a method of assembling a display apparatus, comprising the steps of forming a single-sided board with a through-hole therein, and placing conductive tracks and fixed contacts on a first side of the single-sided board, mounting a display device on a second side of the single-sided board so that a display surface of the display device appears in the through-hole, and soldering terminals of the display device, that extend through respective holes in the single-sided board and project from the first side of the single-sided board, to the conductive tracks.

BRIEF DESCRIPTION OF THE DRAWINGS

The accompanying drawings, which are incorporated in and form a part of the specification, illustrate the preferred embodiment of the present invention and, together with the description, serve to explain the principles of the invention. In the drawings:

FIG. 2 illustrates the assembly procedure for assembling the parts shown in FIG. 1.

DETAILED DESCRIPTION OF THE PREFERRED EMBODIMENTS

Figure 1:
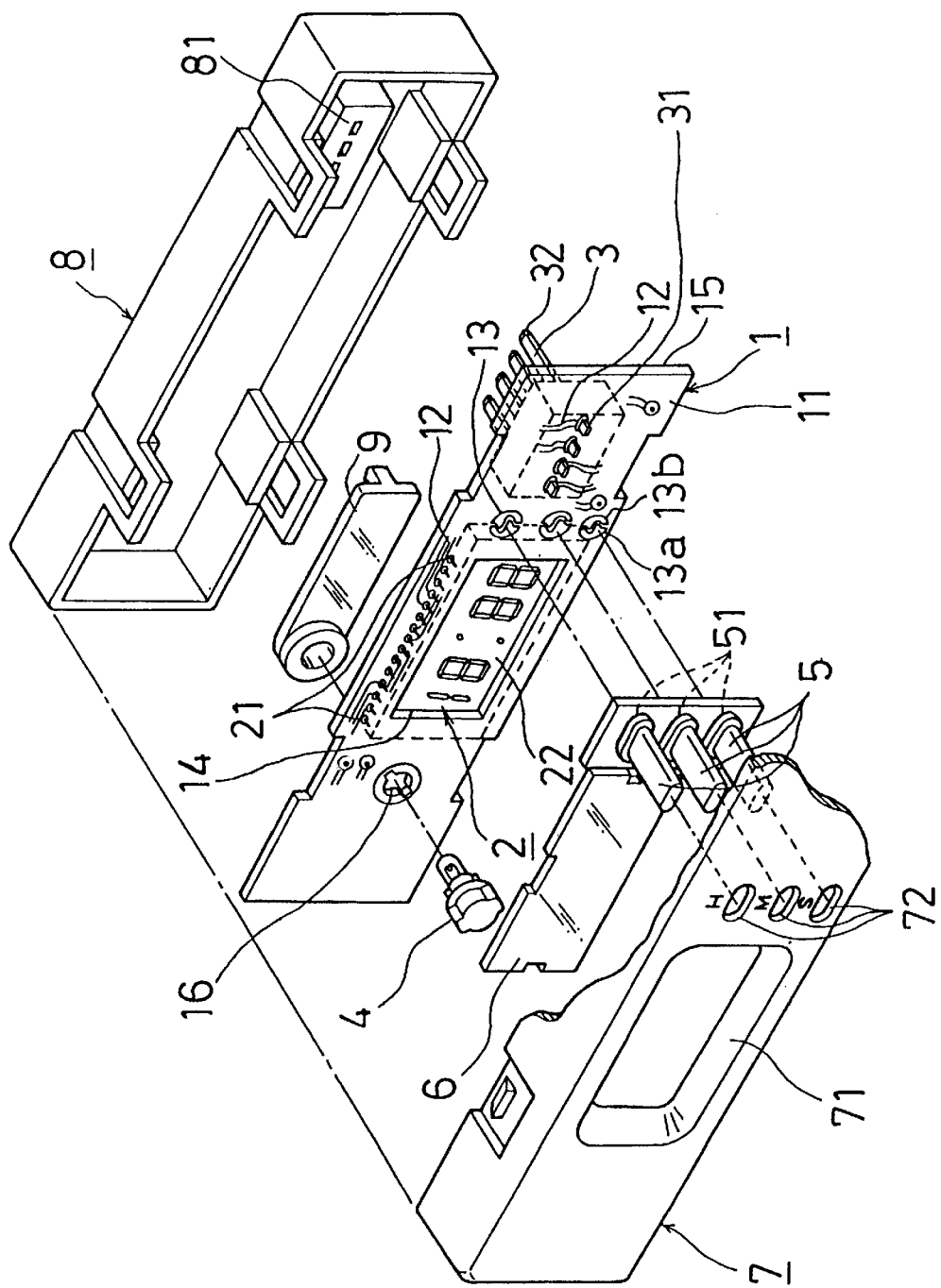
FIG. 1 is an exploded perspective view of the preferred embodiment of the invention.

The preferred embodiment of the present invention will now be described with reference to FIG. 1.

In FIG. 1, reference numeral 1 denotes a single-sided board, reference numeral 2 denotes a display device, reference numeral 3 denotes terminals, reference numeral 4 denotes a lamp, reference numeral 5 denotes an operating member, reference numeral 6 denotes a cover, reference numeral 7 denotes a front case, reference numeral 8 denotes a rear case, and reference numeral 9 denotes a light guide. These structural elements will now be described in detail.

The single-sided board 1 is a plate-like material which is made of, for example, phenol resin and epoxy resin, and which has electrically conductive layers made of a thin sheet of copper or carbon formed on only one side thereof. Electrically conductive tracks 12 and fixed contacts 13 are formed on one side 11 of the single-sided board 1, and through-holes 14 and 16 are formed in the single-sided board 1. The fixed contacts 13 include a pair of electrodes 13a and 13b in the form of carbon deposited on the surface thereof. The electrodes 13a and 13b are part of a switch where operating an operating member 5 (described below) causes a movable contact 51 to bridge between the electrodes 13a and 13b for switching operation. The through-hole 16 receives the lamp 4 fitted thereinto. The light guide 9 directs the light emitted from the lamp 4 to the backside of the display device 2 so as to backlight the display device 2.

The display device 2 is mounted on the other side 15 of the single-sided board 1 as shown in FIG. 1. The terminals 21 are mounted on the single-sided board 1 in such a way that the terminals 21 extend through respective holes in the single-sided board and project from one side 11 of the board 1 and are soldered to the conductive tracks 12. The display surface 22 is aligned with the through-hole 14 formed in the single-sided board 1.

The through-hole 14 is formed at a position where the through-hole 14 is aligned with the display window 71 of the front case 7 upon assembling the single-sided board 1 in a space defined by the front case 7 and the rear case 8. Thus, upon completion of the assembly of the display apparatus, the display surface 22 of the display device 2 may be viewed through the display window 71 of the front case 7 and the through-hole 14 in the single-sided board 1.

The display device 2 indicates time by means of segmented characters. The display device 2 takes the form of an LCD (liquid crystal display) in the preferred embodiment but may take other appropriate forms such as fluorescent displaying device or LEDs (light-emitting diodes).

The terminals 3 are mounted on the other side of the single-sided board 1. One ends 31 of the terminals 3 extend through respective holes in the single-sided board and project from the one side 11 of the single-sided board 1 and are soldered to conductive tracks 12. The other ends 32 of the terminals 3 are electrically connected to the circuit, not shown, on the vehicle side.

The operating members 5 are press-operated by the driver of the vehicle. The operating members 5 have movable contacts 51 made of rubber on the fixed contact sides 13 thereof and are loosely fitted through the operation holes 72 of the front case 7. The operating members 5 are urged against the front case 7 by return springs, not shown.

The cover 6 is made of a transparent resin plate such as acrylic resin colored in moss-green, gray, amber and so on. The cover 6 is located between the display surface 22 of the display device 2 and the display window 71 of the front case 7. The display color of the display device 2 depends on the color of the cover 6.

The rear case 8 cooperates with the front case 7 to form a box-like body that houses the single-sided board 1, and has a connector housing 81 into which the terminals 3 on the single-sided board 1 are fitted.

Although not explicitly shown in FIG. 1, the display device 2 and various circuit elements for controlling the display device 2 are mounted on the other side 15 of the single-sided board 1.

The assembling procedure of the aforementioned display device will now be described with reference to FIG. 2.

At the first stage A, a through-hole 14 is made in the single-sided board 1, and the conductive tracks 12 and fixed contacts 13 are formed on one side 11 of the single-sided board 1.

At the second stage B, following the first stage A, the display device 2 is mounted on the other side 15 of the single-sided board 1 with the display surface 22 of the display device 2 appearing in the through-hole 14 and the terminals 21 of the display device extending through respective holes in the single-sided board 1 so as to project from the one side 11 of the single-sided board 1.

Then, at the third stage C, following the second stage B, the terminals 21 of the display device 2 projecting from the one side 11 of the single-sided board 1 are soldered to the conductive tracks 12.

The operation of the aforementioned embodiment will now be described.

The terminals 3 receive signals from the ignition switch and lighting switch. Upon receiving an ON signal from the ignition switch, the lamp 4 comes on. Upon receiving an ON signal from the lighting switch at, for example, night, the circuit mounted on the single-sided board 1 outputs an intensity-reduction controlling signal which causes the lamp 4 to come on with a reduced intensity illuminating the display device 2.

The display device 2 receives a clock controlling signal from the circuit mounted on the single-sided board 1, irrespective of signals from the ignition switch and lighting switch, to indicate time by means of segmented characters. The time on the display may be adjusted by operating the operating members 5. Operating one of the operating members 5 causes the corresponding movable contact 51 of the operating member 5 to bridge between the electrodes 13a and 13b of the fixed contacts 13, directing the signals to the circuit on the single-sided board 1. For example, pressing the operating member 5 indicated "H" on the front case 7 causes the time on display to increment. Likewise, pressing the operating member 5 indicated "M" for minute or "S" for second causes the time on display to increment.

The present invention includes a single-sided board having fixed contacts and electrically conductive tracks on one side thereof, a through-hole formed in the single-sided board, and a display device mounted on the other side of the single-sided board which display device has terminals and a display surface appearing in the through hole, the terminals respective holes in the single-sided board from one side to the other thereof and being soldered to the electrically conductive tracks on the one side. Thus, the aforementioned construction of the invention provides a simple construction of the display apparatus assembled on only one single-sided board. This construction simplifies assembly procedure, so that switches, such as tact switches, are not necessary. The simple assembly procedure makes it possible to perform a soldering operation in a single stage eliminating subsequent mounting and manual soldering operations of the display device after the board has undergone soldering operation in a solder bath.

The embodiment of the invention includes terminals mounted on the other side of the single-sided board, one ends of which extend through respective holes in the single-sided board and project from one side of the single-sided board and are soldered to the electrically conductive tracks, and the other ends of which are electrically connected to a circuit on a vehicle side. Thus, the invention may conveniently be applied to, for example, a digital clock for vehicles.

The assembling method of the invention includes a first stage where a single-sided board is formed which has a through-hole formed therein, conducting tracks and fixed contacts formed on one side of the single-sided board, a second stage subsequent to the first stage where the display device is mounted on the other side of the single-sided board in such a way that the display surface of the display device appears in the through-hole and the terminals of the display device extend through respective holes to project from the one side of the single-sided board, and a third stage subsequent to the second stage where the terminals of the display device projecting from the one side of the single-sided board are soldered to the conductive tracks. The aforementioned three stages simplify the assembly operation of the apparatus.

The foregoing description of a preferred embodiment of the invention has been presented for purposes of illustration and description. It is not intended to be exhaustive or to limit the invention to the precise form disclosed. It is intended that the scope of the invention be defined by the claims appended hereto.

What is claimed is:

1. A display apparatus, comprising:
   a single-sided board (1) having fixed contacts (13) and electrically conductive tracks (12) formed on a first side (11) of said single-sided board;
   a through-hole (14) formed in said single-sided board (1); and
   a display device (2) mounted on a second side (15) of said single-sided board (1), said display device having a display surface (22) appearing in the through-hole (14)

and terminals (21) extending through respective holes in the single-sided board (1) from said second side (15) to said first side (11) of the single-sided board (1) and being soldered to the electrically conductive tracks (12) on said first side (11).

2. The display apparatus according to claim 1, further comprising a second group of terminals (3) mounted on said second side (15) of said single-sided board (1), said second group of terminals (3) having first ends (31) extending through respective holes in the single-sided board and projecting from said first side (11) of said single-sided board (1) and being soldered to the electrically conductive tracks (12), and said second group of terminals (3) having second ends (32) electrically connected to a vehicle circuit.

3. A method of assembling a display apparatus, comprising the steps of:

forming a single-sided board (1) with a through-hole (14) therein, and placing conductive tracks (12) and fixed contacts (13) on a first side (11) of said single-sided board (1);

mounting a display device (2) on a second side (15) of said single-sided board (1) so that a display surface (22) of the display device (2) appears in the through-hole (14) and terminals (21) of the display device (2) extend through respective holes in the single-sided board (1) so as to project from said first side (11) of the single-sided board; and soldering terminals (21) of the display device (2) projecting from the first side (11) of the single-sided board (1) to the conductive tracks (12).

* * * * *